(12) United States Patent
Yokoyama

(10) Patent No.: US 6,195,787 B1
(45) Date of Patent: *Feb. 27, 2001

(54) LAYOUT DESIGNING METHOD FOR SEMICONDUCTOR INTEGRATED CIRCUITS

(75) Inventor: Moto Yokoyama, Hamamatsu (JP)

(73) Assignee: Yamaha Corporation, Hamamatsu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/811,023

(22) Filed: Mar. 4, 1997

(30) Foreign Application Priority Data

Mar. 5, 1996 (JP) .................................................. 8-47740

(51) Int. Cl.[7] .................................................. G06F 17/50
(52) U.S. Cl. .................................................. 716/8; 716/6; 703/16
(58) Field of Search .................................. 364/488, 489, 364/490, 491, 578; 395/500.37, 500.4, 500.07, 500.09; 716/6, 8; 703/16, 19

(56) References Cited

U.S. PATENT DOCUMENTS

| | | | | |
|---|---|---|---|---|
| 5,404,310 | * | 4/1995 | Mitsuhashi | 364/490 |
| 5,446,676 | * | 8/1995 | Huang et al. | 364/578 |
| 5,473,548 | * | 12/1995 | Omori et al. | 364/489 |
| 5,481,469 | * | 1/1996 | Brasen et al. | 364/483 |
| 5,515,302 | * | 5/1996 | Horr et al. | 364/578 |
| 5,521,834 | * | 5/1996 | Crafts et al. | 364/489 |
| 5,535,370 | * | 7/1996 | Raman et al. | 395/500 |
| 5,553,008 | * | 9/1996 | Huang et al. | 364/578 |
| 5,557,531 | * | 9/1996 | Rostoker et al. | 364/489 |
| 5,602,753 | * | 2/1997 | Fukui | 364/459 |
| 5,625,803 | * | 4/1997 | McNelly et al. | 395/500 |
| 5,648,910 | * | 7/1997 | Ito | 364/490 |
| 5,673,200 | * | 9/1997 | Toyonaga et al. | 364/490 |
| 5,673,420 | * | 9/1997 | Reyes et al. | 395/500 |
| 5,692,160 | * | 11/1997 | Sarin | 395/500 |
| 5,696,694 | * | 12/1997 | Khouja et al. | 364/488 |
| 5,883,812 | * | 3/1999 | Fujii | 364/490 |

* cited by examiner

*Primary Examiner*—Paul R. Lintz
*Assistant Examiner*—Leigh Marie Garbowski
(74) *Attorney, Agent, or Firm*—Pillsbury Madison & Sutro LLP

(57) ABSTRACT

A method of designing a layout of a semiconductor integrated circuit is provided. A logic simulation of a semiconductor integrated circuit to be designed is executed. A number of times of toggle operation of each of circuit elements constituting the semiconductor integrated circuit, which occurs during the execution of the logic simulation, is counted. A consumption power of the each of the circuit elements, determined based on the counted number of times of toggle operation thereof. Constraint conditions to be imposed on designing a layout of the circuit elements, are determined based on results of the estimation of the consumption power.

8 Claims, 3 Drawing Sheets

LAYOUT DESIGNING METHOD FOR SEMICONDUCTOR INTEGRATED CIRCUITS

BACKGROUND OF THE INVENTION

1. Field of the Invention

This invention relates to a method of designing the layout of a semiconductor integrated circuit.

2. Prior Art

Recently, various excellent CAD (Computer Aided Design) tools using computer technology have been developed. These CAD tools are now used to carry out almost all required operations in developing semiconductor integrated circuits, such as logic designing and layout designing. In recent years, however, a CAD tool merely capable of automatic designing has not been deemed satisfactory, and there is an increasing demand been for a CAD tool capable of high-quality automatic designing. In particular, the electric performance of the resulting semiconductor integrated circuit devices such as operating speed and power consumption depends on whether layout designing is good or not, and therefore numerous proposals have been made for ensuring the high quality of the final product at the stage of layout designing.

FIG. 2 shows a flowchart of automatic designing carried out by an automatic designing system proposed under the above circumstances. In designing a semiconductor integrated circuit by using this system, a designer prepares function descriptive information and information related to constraint conditions (steps S1 and S2). The function descriptive information consists of information defining the circuit structure of a semiconductor integrated circuit to be designed, more specifically a list describing what macro (the kind or type of a standard part such as a NAND gate and a NOR gate) is to be used for each circuit element of the circuit, and how the wiring is to be provided between the circuit element and another circuit element. The information related to constraint conditions consists of information describing conditions required for setting the operating timing of circuit elements of the semiconductor integrated circuit to be designed to desired timing. For example, in the case where there is a critical path which requires setting the propagation delay time of a signal transmitted therethrough within a predetermined range, the constraint conditions include component elements on the critical path and the range of the propagation delay time.

The function descriptive information and the constraint condition information thus prepared are delivered to a CAD tool. In the CAD tool, there are previously stored various kinds of libraries needed for automatic designing of semiconductor integrated circuits, including a logic simulation library defining the contents of a logic calculation to be performed by each macro, and a layout library defining artwork information (related to dimensions and shapes of patterns, for example) associated with transistors constituting the respective macros, wiring patterns and others. The CAD tool refers to these various libraries to thereby start automatic designing according to the function descriptive information and the constraint condition information prepared by the designer.

First, a processing called "logic synthesization" is carried out at a step S3. This processing prepares by logic synthesization a file defining the structure of a circuit to be designed by the automatic designing as a logic circuit, based on the function descriptive information, constraint condition information and logic simulation library.

Then, a logic simulation is carried out using the thus obtained file and a test pattern (time series signal pattern defining an input waveform applied to the circuit, and a response waveform to be obtained from the circuit when the input waveform is applied) that is used for confirming the function, to determine whether or not the circuit defined by the function descriptive information exhibits the intended logical function (step S4).

When no abnormality is found in the logical function exhibited by the circuit as a result of the logic simulation, the procedure proceeds to a layout processing at a step S5. The layout processing is roughly divided into two processings. In the first processing, a cell (hereinafter referred to as an artwork cell) including transistors, wiring pattern and others, which corresponds to each of the macros appearing in the function descriptive information, is virtually positioned or arranged in a chip. The artwork cell corresponding to each macro is prepared using the artwork information in the layout library which corresponds to the relevant macro. If a critical path is designated as a constraint condition, an artwork cell corresponding to each component element on the critical path is preferentially positioned, and after completion of the positioning, other artwork cells with a lower priority are positioned. In the second processing, the wiring pattern, such as a pattern of signal wires connecting the respective art work cells virtually positioned in the chip, feeder wires for supplying electric power and earthing wires, is produced. The wiring pattern for the signal wires is automatically produced according to the above-described function descriptive information.

After completion of the layout processing, a power consumption simulation is carried out at a step S6. Specifically, resistance values of the feeder wires and earthing wires produced by the layout processing are determined, consumption current values of component elements constituting the semiconductor integrated circuit are calculated, and it is determined based on the obtained resistance values and consumption current values whether or not the consumption current can be reliably allowed to flow into each of the feeder wires and earthing wires.

For example, a result of the layout processing is shown in FIG. 3. In this example, elements M1 and M2 are connected to an earthing wire L1, and elements M3, M4, and M5 are connected to an earthing wire L2 and consumption currents I1 to I5 flow through the earthing wire L1 or L2 to a bonding pad for an earthing terminal. The consumption power simulation calculates the consumption currents I1 to I5. As a result, if it is determined that the total consumption current flowing through the earthing wire L2 is excessive such that electromigration can occur, the procedure returns to a previous processing such as the layout processing or the logic simulation to carry out a redesign. On the other hand, if the calculated consumption current value flowing through each earthing wire falls within a tolerance range determined based on the wire width, etc., the result of the layout processing is adopted as it is, that is, a mask is produced based on the layout result, and an engineering sample (ES) of the semiconductor integrated circuit is experimentally manufactured (step S7). Then, electrical properties of the obtained ES are evaluated. If the evaluation results are found satisfactory, the development is completed, whereas if they are not satisfactory, a redesign of the semiconductor integrated circuit is carried out.

According to the above described conventional automatic designing system, by previously setting constraint conditions, it is possible to carry out a layout design which takes into consideration the operating timing of circuit elements of the semiconductor integrated circuit, such as presence of a critical path. The magnitude of current flowing to each circuit element of a semiconductor integrated circuit, however, cannot be determined until after the layout of circuit elements constituting the circuit and the wiring system connecting them are fixed, and therefore the reliability of the current magnitude is confirmed after completion of the layout designing as stated above. This, however, can often necessitate redesigning of the layout, leading to an increased developing cost. Further, although in the case of a semiconductor integrated circuit where the consumption current of each circuit element can be grasped beforehand, a countermeasure such as redesigning of the layout can be taken before trial manufacture of ES, it is actually very difficult in the case of a LSI to determine beforehand the consumption current of each of numerous circuit elements constituting the LSI. Thus, problems of consumption current or consumption power of a semiconductor integrated circuit are often actually found to exist only after completion of trial manufacture of an ES and evaluation thereof.

SUMMARY OF THE INVENTION

It is an object of the invention to provide a layout designing method for semiconductor integrated circuits, which is capable of performing a layout of circuit elements of a semiconductor integrated circuit to be designed, with the consumption power of the circuit taken into consideration, thereby reducing the cost.

To attain the above object, the present invention provides a method of designing a layout of a semiconductor integrated circuit, comprising the steps of (1) executing a logic simulation of a semiconductor integrated circuit to be designed, (2) counting a number of times of toggle operation of the each of circuit elements constituting the semiconductor integrated circuit, the toggle operation occurring during the execution of the logic simulation, (3) estimating a consumption power of each of the circuit elements, based on the counted number of times of toggle operation thereof, and (4) determining constraint conditions to be imposed on designing a layout of the circuit elements, based on results of the estimation of the consumption power.

Preferably, the above step (3) includes preparing beforehand a consumption power library defining a value of consumption power of a macro corresponding to the each of the circuit elements for each of the actual operating conditions of the semiconductor integrated circuit, and determining an estimated value of consumption power of each of the circuit elements, based on the counted number of times of toggle operation of the each of the circuit elements, the value of consumption power of the macro corresponding to each of the circuit elements for each of the actual operating conditions of the semiconductor integrated circuit.

Preferably, the above step (4) includes determining numbers of feeder wires and earthing wires to be provided within a chip of the semiconductor integrated circuit, and the widths thereof, based on the results of the estimation of the consumption power, and setting the determined numbers of feeder wires and earthing wires and the widths thereof as the constraint conditions.

Further preferably, the step 4) includes determining a location of each of the circuit elements to be set within the chip, based on results of the estimation of the consumption power, and setting the determined location as one of the constraint conditions.

The above and other objects, features and advantages of the invention will become more apparent from the following detailed description taken in conjunction with the accompanying drawing.

DETAILED DESCRIPTION

Figure 1:
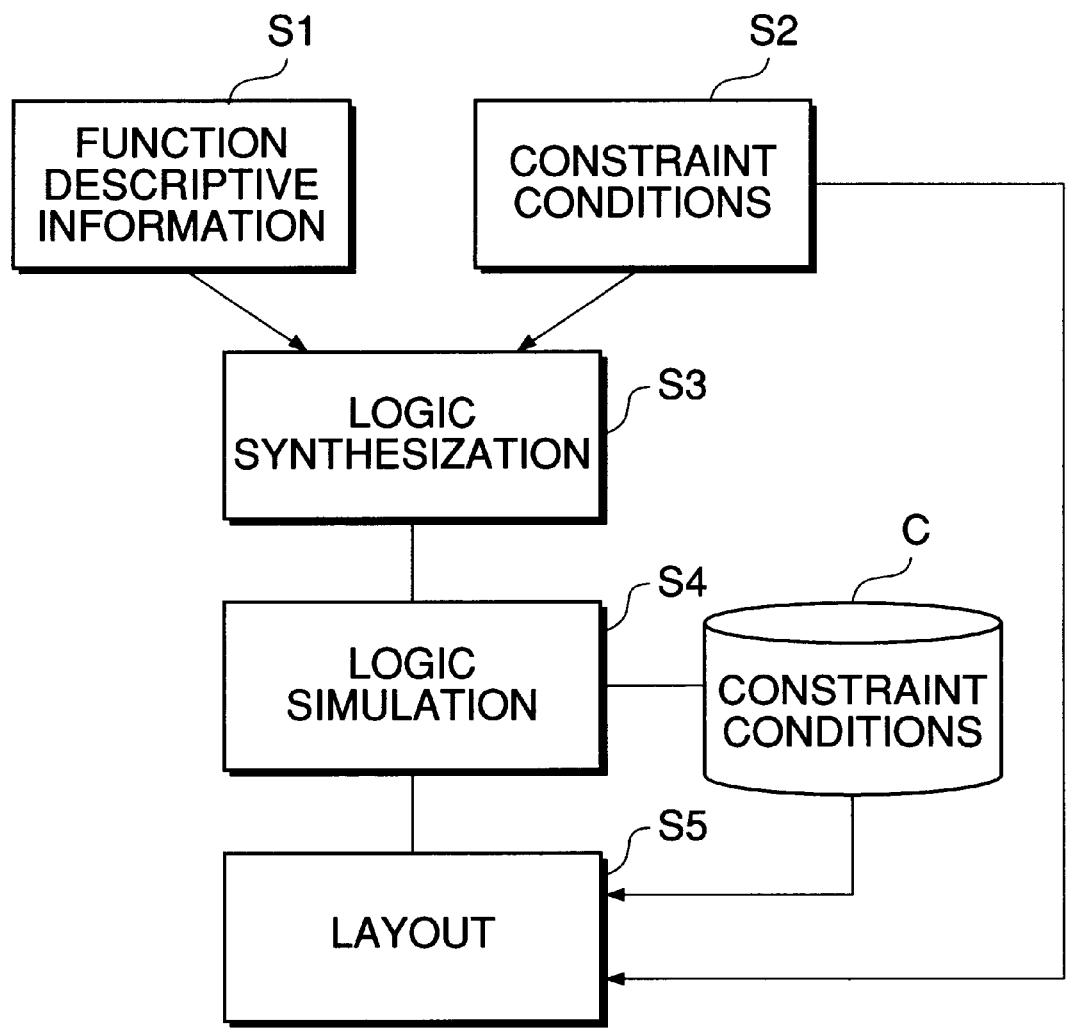
FIG. 1 is a flowchart showing steps for implementing a layout designing method for semiconductor integrated circuits by an automatic designing system, according to an embodiment of the present invention.

The invention will now be described in detail with reference to the drawing showing a preferred embodiment thereof.

Figure 2:
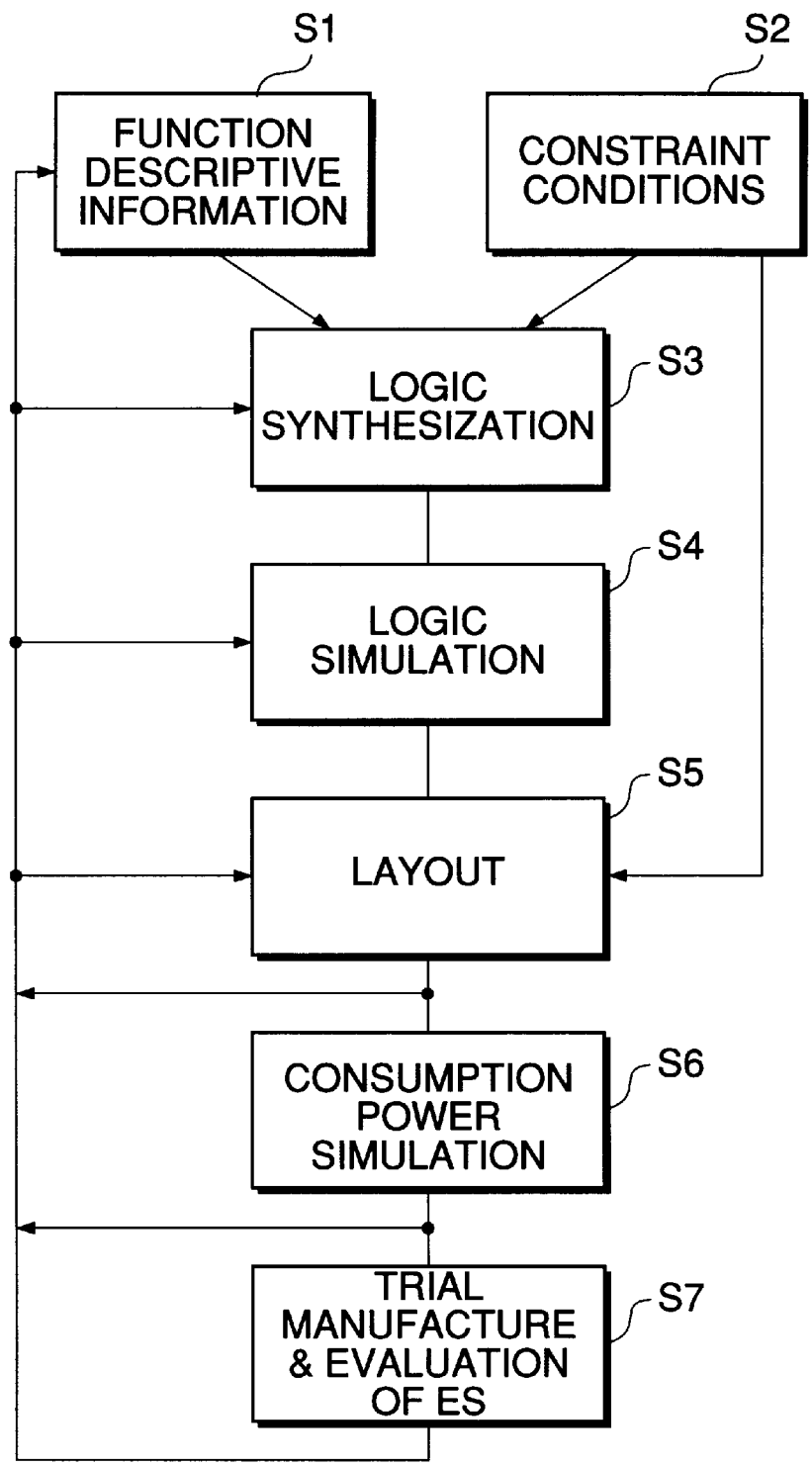
FIG. 2 is a flowchart showing showing steps for implementing a conventional layout designing method.
Figure 3:
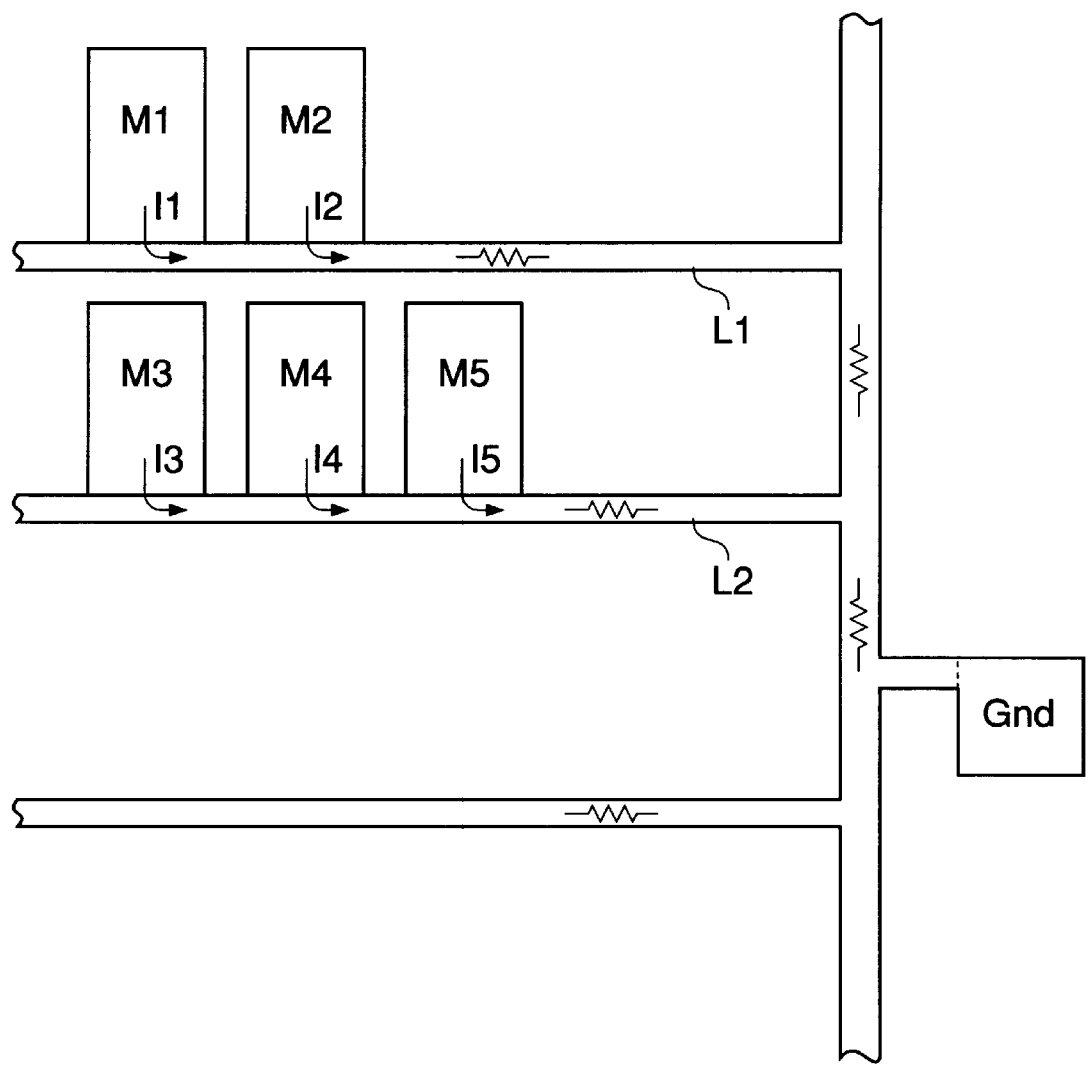
FIG. 3 is a view useful in explaining a determination as to results of a layout design by the conventional layout designing method.

Referring to FIG. 1, there is shown a flowchart showing steps for implementing a layout designing method for semiconductor integrated circuits by an automatic designing system, according to an embodiment of the invention. In the figure, steps corresponding to those in FIG. 2 are designated by identical step numbers. An essential feature of the present embodiment lies in earlier executed steps inclusive of a step S5, i.e. a layout step, while steps executed after the layout step S5 are similar or identical to steps S6 and S7 shown in FIG. 2 and therefore illustration thereof is omitted from FIG. 1.

Essential features of the present invention are as follows:

(1) The consumption power of each of the circuit elements constituting a semiconductor integrated circuit to be designed is estimated when a logic simulation (step S4) is executed;

a. More specifically, to estimate the consumption power, a consumption power library defining consumption power at a unit frequency is prepared beforehand for each macro. The value of consumption power depends upon various conditions including the process employed in manufacturing a semiconductor integrated circuit, the power supply voltage at which the semiconductor integrated circuit operates, and the operating temperature. Therefore, the consumption power library should desirably be in the form of a table or tables defining consumption power of each macro according to these conditions, or alternatively.a consumption power library should be prepared for each of the conditions so that information is suitably selected from the libraries, which conforms to desired conditions, for use. Generally, the consumption power of a macro is influenced by the rise time and fall time of an input signal to the macro, etc. Therefore, the consumption power library should preferably contain data obtained by a timing simulation or the like.

b. During execution of a logic simulation by a logic simulator implemented by a CAD tool, the number of times of toggle operation of each of the circuit elements constituting a semiconductor integrated circuit to be designed (inversion of the output from the circuit element from "1" to "0" or vice versa) is counted and stored per each circuit element. After completion of the counting of the number of times of toggle operation, the counted number of times of toggle operation of each circuit element and a value of consumption power of a macro corresponding to the each circuit element, stored in the consumption power library, are multiplied together. An estimated value of the consumption power of each circuit element is determined based on the result of the multiplication and actual operating conditions of the semiconductor integrated circuit such as operating frequency.

(2) Then, based on the estimated consumption power value of each circuit element obtained as above, constraint conditions C to be imposed upon designing a layout of each circuit element of the semiconductor integrated circuit are set, and the layout is designed according to the set constraint conditions C (step S5). More specifically, the following constraint conditions are set:

a. A value of total consumption power of the semiconductor integrated circuit is determined, and based on the determined total consumption power value, the numbers of feeder wires and earthing wires to be provided within a chip of the circuit as well as widths thereof are determined and set as constraint conditions. After the constraint conditions related to the entire layout are thus set, below-mentioned constraint conditions b to d related to the location of each circuit element are set.

b. A central portion of a chip has a lower degree of heat dissipation, and therefore the layout should be made such that elements consuming large power are not concentrated on the central portion of the chip. Therefore, with respect to an element for which a large estimated value of consumption power has been obtained, a constraint condition is set to the effect that the element should forcibly or preferentially be arranged at a peripheral portion of the chip.

c. If many elements consuming large power exist, the layout should be made such that these elements are not concentrated at a single place. Therefore, a constraint condition is set to the effect that such large power-consuming elements are arranged separately from each other.

d. If large power-consuming elements are connected to a common feeder wire or a common earthing wire, there is a clean that electromigration will occur in the common feeder wire or the common earthing element. Therefore, a constraint condition is set to the effect that such large power-consuming elements should be connected to respective separate feeder wires and separate earthing wires, or that if required, the feeder wire or the earthing wire should have a width larger than a predetermined width.

As described above, according to the invention, during the stage of logic simulation, the consumption power of each of the circuit elements constituting a semiconductor integrated circuit to be designed is estimated, and constraint conditions are set with the estimated consumption power taken into consideration to thereby carry out layout designing. As a result, it is possible to avoid a situation that problems of consumption current or consumption power of a semiconductor integrated circuit are often actually found to exist after completion of the layout designing or a subsequent step.

It is to be understood that the present invention is not limited to details of the preferred embodiment described above but may be embodied with changes, modifications and improvements without departing from the scope of the appended claims.

What is claimed is:

1. A method of designing a layout of a semiconductor integrated circuit, the method comprising the steps of:

(1) executing a logic simulation of the semiconductor integrated circuit to be designed to determine whether the semiconductor integrated circuit as defined by function descriptive information defining a circuit structure of the semiconductor integrated circuit exhibits an intended logical function;

(2) counting a number of times of toggle operation of each of a plurality of circuit elements constituting said semiconductor integrated circuit, said toggle operation occurring during said execution of said logic simulation;

(3) estimating a consumption power of each of said circuit elements when said logic simulation is executed and before designing the layout of said circuit elements, based on the counted number of times of toggle operation thereof, and identifying circuit elements having an estimated value of power consumption greater than a predetermined value;

(4) determining constraint conditions to be imposed on the layout of said circuit elements when said logic simulation is executed and before designing the layout of said circuit elements, based on results of said estimation of the consumption power; and (5) designing the layout of said circuit elements according to the determined constraint conditions, wherein with respect to the circuit elements identified as having an estimated value of consumption power greater than the predetermined value, said constraint conditions include arranging said identified circuit elements at a peripheral portion of said semiconductor integrated circuit.

2. The method as claimed in claim 1, wherein said step (3) includes preparing beforehand a consumption power library defining a value of consumption power of a macro corresponding to each of said circuit elements for each of actual operating conditions of said semiconductor integrated circuit, and determining an estimated value of consumption power of each of said circuit elements, based on the counted number of times of toggle operation of each of said circuit elements, said value of consumption power of said macro corresponding to each of said circuit elements for each of said actual operating conditions of said semiconductor integrated circuit.

3. The method as claimed in claim 1, wherein said step (4) includes determining numbers of feeder wires and earthing wires to be provided within said semiconductor integrated circuit, and widths thereof, based on said results of said estimation of the consumption power, and setting the determined numbers of feeder wires and earthing wires and widths thereof as one of said constraint conditions.

4. A method of designing a layout of a semiconductor integrated circuit, the method comprising the steps of:

(1) executing a logic simulation of the semiconductor integrated circuit to be designed to determine whether the semiconductor integrated circuit as defined by function descriptive information defining a circuit structure of the semiconductor integrated circuit exhibits an intended logical function;

(2) counting a number of times of toggle operation of each of a plurality of circuit elements constituting said semiconductor integrated circuit, said toggle operation occurring during said execution of said logic simulation;

(3) estimating a consumption power of each of said circuit elements when said logic simulation is executed and before designing the layout of said circuit elements, based on the counted number of times of toggle operation thereof, and identifying circuit elements having an estimated value of power consumption greater than a predetermined value;

(4) determining constraint conditions to be imposed on the layout of said circuit elements when said logic simulation is executed and before designing the layout of said circuit elements, based on results of said estimation of the consumption power; and (5) designing the layout of said circuit elements according to the determined constraint conditions, wherein with respect to the circuit elements identified as having an estimated value of consumption power greater than the predetermined value, said constraint conditions include arranging said identified circuit elements separately from each other.

5. The method as claimed in claim 4, wherein said step (4) includes determining numbers of feeder wires and earthing wires to be provided within said semiconductor integrated circuit, and widths thereof, based on said results of said estimation of the consumption power, and setting the determined numbers of feeder wires and earthing wires and widths thereof as one of said constraint conditions.

6. The method as claimed in claim 4, wherein said step (3) includes preparing beforehand a consumption power library defining a value of consumption power of a macro corresponding to each of said circuit elements for each of actual operating conditions of said semiconductor integrated circuit, and determining an estimated value of consumption power of each of said circuit elements, based on the counted number of times of toggle operation of each of said circuit elements, said value of consumption power of said macro corresponding to each of said circuit elements for each of said actual operating conditions of said semiconductor integrated circuit.

7. A method of designing a layout of a semiconductor integrated circuit, the method comprising the steps of:

(1) executing a logic simulation of the semiconductor integrated circuit to be designed to determine whether the semiconductor integrated circuit as defined by function descriptive information defining a circuit structure of the semiconductor integrated circuit exhibits an intended logical function;

(2) counting a number of times of toggle operation of each of a plurality of circuit elements constituting said semiconductor integrated circuit, said toggle operation occurring during said execution of said logic simulation;

(3) estimating a consumption power of each of said circuit elements when said logic simulation is executed and before designing the layout of said circuit elements, based on the counted number of times of toggle operation thereof, and identifying circuit elements having an estimated value of power consumption greater than a predetermined value;

(4) determining constraint conditions to be imposed on the layout of said circuit elements when said logic simulation is executed and before designing the layout of said circuit elements, based on results of said estimation of the consumption power; and (5) designing the layout of said circuit elements according to the determined constraint conditions, wherein with respect to the circuit elements identified as having an estimated value of consumption power greater than the predetermined value, said constraint conditions include at least one condition selected from the group of designing separate current supplying wirings for the identified circuit elements to have a width greater than a predetermined width.

8. The method as claimed in claim 7, wherein said step (3) includes preparing beforehand a consumption power library defining a value of consumption power of a macro corresponding to each of said circuit elements for each of actual operating conditions of said semiconductor integrated circuit, and determining an estimated value of consumption power of each of said circuit elements, based on the counted number of times of toggle operation of each of said circuit elements, said value of consumption power of said macro corresponding to each of said circuit elements for each of said actual operating conditions of said semiconductor integrated circuit.

* * * * *